United States Patent
Schieve et al.

(10) Patent No.: US 6,793,766 B2
(45) Date of Patent: Sep. 21, 2004

(54) APPARATUS HAVING PLATFORMS POSITIONED FOR PRECISE CENTERING OF SEMICONDUCTOR WAFERS DURING PROCESSING

(75) Inventors: Eric W. Schieve, Palo Alto, CA (US); Lawrence Chung-Lai Lei, Milpitas, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 09/755,516

(22) Filed: Jan. 4, 2001

(65) Prior Publication Data

US 2002/0084033 A1 Jul. 4, 2002

(51) Int. Cl.[7] .............................. C23F 1/00; C23C 16/00; H01L 21/306
(52) U.S. Cl. ............................ 156/345.32; 156/345.31; 118/719; 414/935; 204/298.25; 204/298.35
(58) Field of Search .......................... 118/719; D23/384; 414/935, 936, 939, 941; 204/298.25, 298.35

(56) References Cited

U.S. PATENT DOCUMENTS

| | | | | |
|---|---|---|---|---|
| 4,854,611 A | * | 8/1989 | Press | 285/3 |
| 5,076,205 A | * | 12/1991 | Vowles et al. | 118/719 |
| 5,151,008 A | * | 9/1992 | Ishida et al. | 414/744.5 |
| 5,195,113 A | * | 3/1993 | Kuwabara | 378/34 |
| 5,611,861 A | * | 3/1997 | Higashi | 118/719 |
| 5,746,562 A | * | 5/1998 | Hasegawa et al. | 414/217 |
| 5,855,681 A | * | 1/1999 | Maydan et al. | 118/719 |
| 5,920,076 A | * | 7/1999 | Burgin et al. | 250/492.21 |
| 6,022,185 A | * | 2/2000 | Mokuo | 414/744.6 |
| 6,032,419 A | * | 3/2000 | Hurwitt | 49/475.1 |
| 6,155,768 A | * | 12/2000 | Bacchi et al. | 414/416 |
| 6,186,722 B1 | * | 2/2001 | Shirai | 414/217 |
| 6,273,664 B1 | * | 8/2001 | Doche | 414/217 |
| 6,430,468 B1 | * | 8/2002 | Tepman et al. | 700/218 |

FOREIGN PATENT DOCUMENTS

| | | | | |
|---|---|---|---|---|
| EP | 480735 A | * | 4/1992 | C23C/16/06 |
| JP | 07-297254 | * | 11/1995 | H01L/21/68 |

* cited by examiner

*Primary Examiner*—Parviz Hassanzadeh
*Assistant Examiner*—Karla Moore
(74) *Attorney, Agent, or Firm*—Moser Patterson & Sheridan

(57) ABSTRACT

Apparatus for processing multiple semiconductor wafers, includes a transfer chamber, a first processing chamber mounted in fixed relation to the transfer chamber and having a first wafer-holding platform with a center, a second processing chamber mounted in adjustable relation to the transfer chamber and to the first chamber and having a second wafer-holding platform with a center, and a robot rotatably mounted within the transfer chamber and having first and second wafer-holding arms spaced parallel to each other for inserting a pair of wafers simultaneously into the first and second chambers and for placing the wafers accurately centered over the respective platforms. The spacing of the platform centers is adjusted relative to the spacing of the robot arms such that the wafers are centered and placed with a preselected degree of accuracy onto the respective platforms for efficient processing of the wafers.

32 Claims, 3 Drawing Sheets

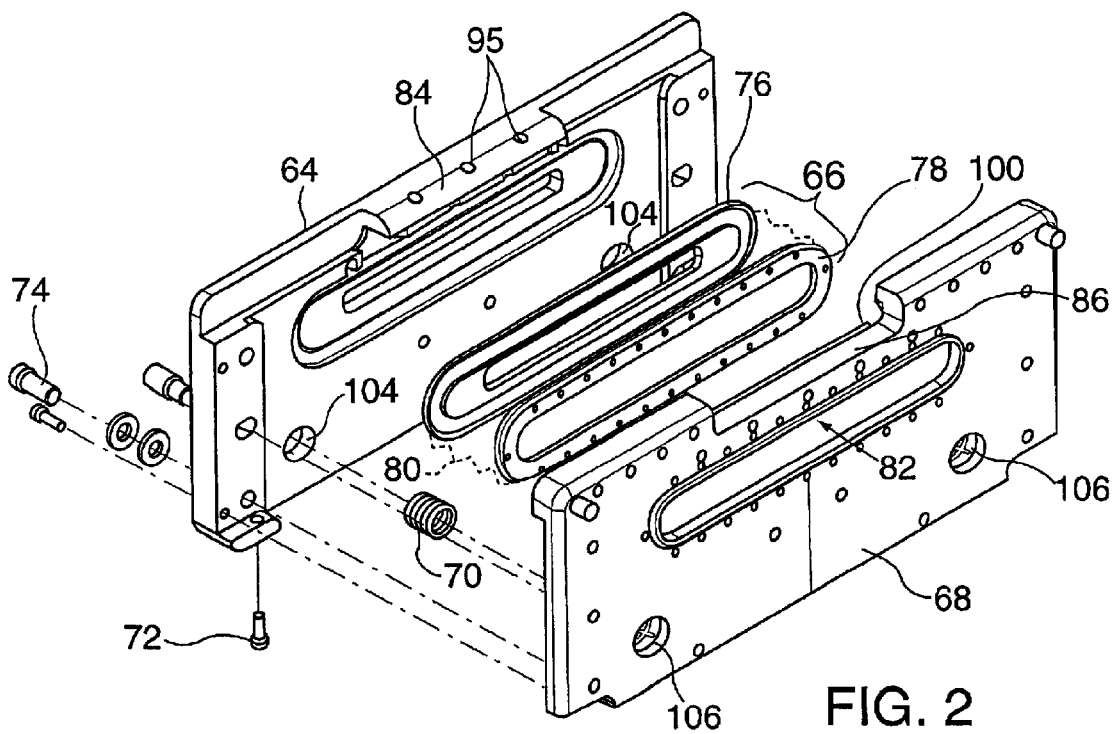
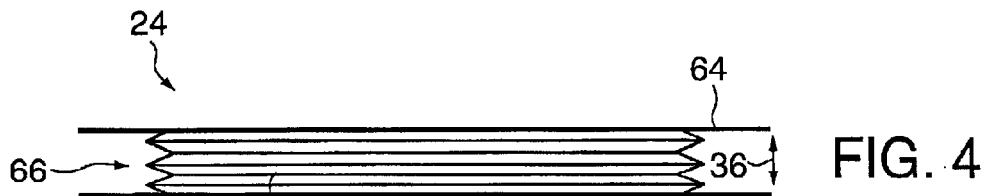
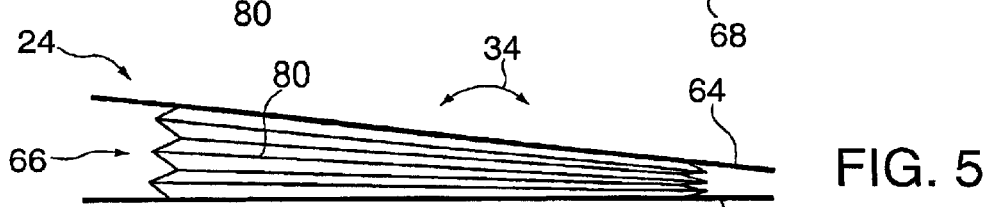
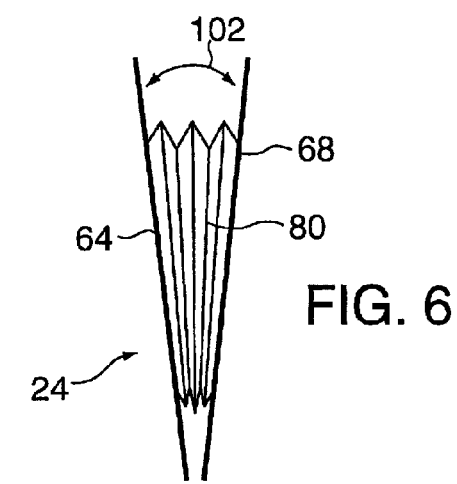

APPARATUS HAVING PLATFORMS POSITIONED FOR PRECISE CENTERING OF SEMICONDUCTOR WAFERS DURING PROCESSING

FIELD OF THE INVENTION

This invention relates to an apparatus ensuring the accurate placement of semiconductor wafers onto respective platforms (or susceptors) within reaction chambers which are precisely (and adjustably) spaced apart, the apparatus providing compensation for dimensional variations due to mechanical tolerances and reducing the effects of thermal expansion or contraction with changes in temperature.

BACKGROUND OF THE INVENTION

Today's semiconductor circuits have features such as vias with diameters that are a small fraction of a micron, for example, only about 0.13 micron, with depths of 4 to 5 times the diameter. Such small via diameters and large depth to diameter ratios make it difficult with currently used materials (e.g., aluminum or copper) to properly metalize the vias completely down to their lower ends. Accordingly, a chemical vapor metalizing process using a highly volatile precursor compound of tungsten, such as tungsten hexaflouride ($WF_6$), is advantageously used to metalize the vias. In order to keep the tungsten being deposited on the exposed surface of the wafer from being deposited beyond and/or beneath the edge or rim of the wafer, inert gas, such as argon or argon mixed with helium, is flowed in an annular stream of the gas upward and over the rim. Flowing such a stream of inert gas, termed "edge-purging", reduces or eliminates tungsten deposition adjacent the edge of the wafer by diluting or physically excluding the $WF_6$ precursor gas. For edge-purging to be fully effective, however, each wafer should be accurately centered on its respective platform.

In order to increase manufacturing throughput for a given capital investment, two wafer platforms can be mounted in a processing chamber. However, with previously known apparatus the exact positions of the centers of the platforms can vary because of manufacturing tolerances or because of thermal expansion or contraction of the apparatus caused in turn by changes of temperature. Unless these dimensional variations are properly compensated for they can significantly affect the efficiency of edge-purging because of inaccurate centering of the wafers when placed on their respective platforms. The present invention provides a simple and effective way of overcoming these difficulties.

SUMMARY OF THE INVENTION

In accordance with the invention, in one specific aspect thereof, there is provided an apparatus for processing semiconductor wafers. The apparatus provides for accurate placement of two or more wafers onto respective processing platforms by substantially reducing mechanical tolerance and other variations in the positions of the platforms relative to that of a wafer-handling robot.

(Claim 1) From a first apparatus aspect, the present invention is an apparatus for processing multiple semiconductor wafers. The apparatus comprises a transfer chamber, first and second processing chamber, and a robot. The first processing chamber is mounted in fixed relation to the transfer chamber and has a first wafer-holding platform with a center. The second processing chamber is mounted in adjustable relation to the transfer chamber and to the master chamber and has a second wafer-holding platform with a center. The robot is rotatably mounted within the transfer chamber and has first and second wafer-holding arms spaced parallel to each other for inserting a pair of wafers simultaneously into the first and second chambers and for placing the wafers accurately centered over the respective platforms. The spacing of the platform centers is adjusted relative to the spacing of the robot arms such that the wafers are centered and placed with a preselected degree of accuracy onto the respective platforms for efficient processing of the wafers.

(Claim 3) From a second apparatus aspect, the invention is an apparatus for processing multiple semiconductor wafers. The apparatus comprises a transfer chamber, first and second processing chamber, a mechanism for adjustably mounting the second chamber in relation to the first chamber and to the transfer chamber, and a robot. The first processing chamber is mounted in known relation to the transfer chamber and has a first wafer-holding platform with a center. The second processing chamber has a second wafer-holding platform with a center. The mechanism provides a plurality of position adjustments for the second chambers. The robot is rotatably mounted within the transfer chamber and has first and second wafer-holding arms spaced parallel to each other for inserting a pair of wafers simultaneously into the first and second chambers and for placing the wafers accurately centered over the respective platforms. The spacing of the platform centers are adjusted relative to the spacing of the robot arms such that the wafers are centered and placed with a preselected degree of accuracy onto the respective platforms for efficient processing of the wafers.

(Claim 7) From a third aspect the invention is an apparatus for processing at least two semiconductor wafers simultaneously. The apparatus comprises a transfer chamber, a load-lock chamber adjacent the transfer chamber, first and second processing chambers, adjusting means for adjustably mounting the second chamber in relation to the first chamber and to the transfer chamber, and a robot. The first processing chamber is mounted in known relation to the transfer chamber and has a first wafer-holding platform with a center. The second processing chamber has a second wafer-holding platform with a center. The adjusting means has a bellows assembly positioned between the transfer chamber and the second chamber and provides for relative movement thereof and also provides a wafer passageway between the chambers while maintaining an hermetic seal. The robot is rotatably mounted around a center axis within the transfer chamber and has first and second wafer-holding arms spaced parallel to each other for withdrawing a pair of wafers from the load-lock chamber and inserting the pair of wafers simultaneously into the first and second chambers and for positioning both of the wafers with a preselected degree of accuracy over the respective platforms. The spacing of the platform centers is adjusted to a preselected degree of accuracy by the adjusting means relative to each other and to the spacing of the robot arms and the center axis such that the wafers are centered and placed with the preselected degree of accuracy onto the respective platforms for efficient processing of the wafers.

(Claim 9) From a fourth aspect the invention is an apparatus for processing a pair of semiconductor wafers simultaneously. The apparatus comprises a transfer chamber, a load-lock chamber adjacent the transfer chamber, first and second processing chambers, mechanical means for adjustably mounting the second chamber in relation to the first chamber and to the transfer chamber, mechanical means for adjustably mounting the second chamber in relation to the first chamber and to the transfer chamber, a slit valve, and a remotely controlled robot. The first processing chamber is mounted in fixed relation to the transfer chamber and has a first wafer-holding platform with a center. The second processing chamber has a second wafer-holding platform with a center. The mechanical means supports the second chamber against the load-lock chamber in cantilever fashion and has a bellows assembly positioned between the transfer chamber and the second chamber to provide for relative movement thereof and to provide a wafer passageway between the respective chambers while maintaining an hermetic seal. The remotely controlled robot is rotatably mounted around a center axis within the transfer chamber and has first and second wafer-holding arms spaced parallel to each other for withdrawing a pair of wafers from the load-lock chamber and inserting the pair of wafers simultaneously into the first and second chambers and for positioning both of the wafers to a preselected degree of accuracy over the respective platforms. The spacing of the platform centers are adjusted by the mechanical means relative to each other and to the spacing of the robot arms and the center axis such that the wafers are centered and placed with the preselected degree of accuracy onto the respective platforms for efficient processing of the wafers.

A better understanding of the invention will be gained from the following description given in conjunction with the accompanying drawings and claims.

BRIEF DESCRIPTION OF THE DRAWINGS

FIG. 2 is an exploded view in perspective showing a mechanism provided according to the invention for positioning the center of one of the dual chambers with great accuracy relative to the other and to a wafer-handling robot;

FIG. 4 is a schematic plan view of a portion of the mechanism of FIG. 2 illustrating how a bellows (a central part of the mechanism) can be expanded or contracted to adjust the longitudinal position of the one chamber;

FIG. 5 is a schematic plan view of the bellows of FIG. 2 illustrating how the bellows can be compressed at either end to adjust the sideways position of the one chamber; and FIG. 6 is a schematic side view of the bellows of FIG. 2 showing how the bellows can be compressed lengthwise along an edge to adjust the vertical position of the chamber.

DETAILED DESCRIPTION

Figure 1:
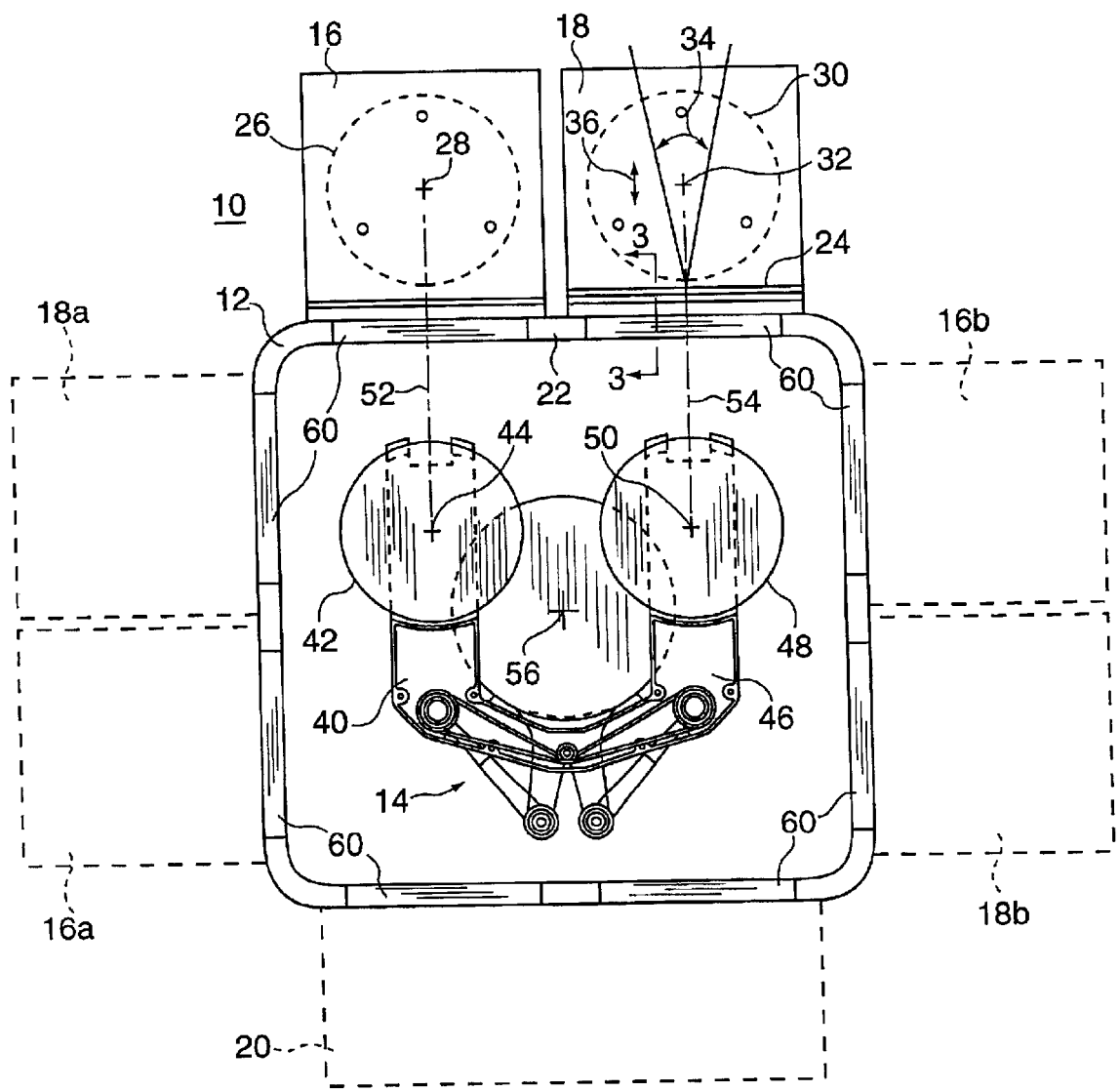
FIG. 1 is a schematic plan view, partially broken away, showing portions of an apparatus embodying features of the invention with dual chambers (one fixed and the other adjustable) for accurately processing semiconductor wafers.

Referring now to FIG. 1, there is shown a schematic plan view of an apparatus 10 embodying features of the invention, for accurately processing two or more semiconductor wafers simultaneously. The apparatus 10 comprises a transfer chamber 12, a wafer-handling robot 14, a first wafer-processing chamber 16, a second wafer-processing chamber 18, a load-lock chamber 20 (shown in dashed outline), and additional wafer-processing chambers 16a, 18a, 16b, and 18b (all shown in dashed outline) which may be identical to the respective chambers 16 and 18.

The chamber 16 is attached in fixed relation to an outer side of a wall 22 (one of four) of the transfer chamber 12. The chamber 18, on the other hand, is attached to the wall 22 by a mechanism, indicated at 24, provided by the invention and which permits the chamber to be adjusted in position in the "X", "Y" and "Z" directions relative to the transfer chamber 12, and to the robot 14. The mechanisms 24 will be described in detail hereinafter.

The chamber 16, which for convenience is termed the "master" chamber, contains a wafer-supporting platform 26 (shown as a dashed line circle) with a center at 28, and the chamber 18, termed the "slave" platform, contains a wafer-supporting platform 30 (shown as a dashed line circle) with a center at 32. The mechanism 24 permits precise adjustment of the slave chamber 18 and the exact position of the platform center 32 by a small angle indicated at 34 lying in a horizontal plane (i.e., the plane of FIG. 1) and by a small amount longitudinally, indicated by an arrow 36 lying within the horizontal plane. As will be explained hereinafter, the position of the slave chamber 18 may also be adjusted slightly in the vertical direction. Thus, the exact position in the "X", "Y", and "Z" directions of the platform center 32 can be precisely set relative to the position of the platform center 28 and the robot 14. Except for their different modes of attachment to the wall 22 of the transfer chamber 12, the master and slave chambers 16 and 18 may be identical to each other.

The robot 14 (well known in the art) has a first horizontal arm 40 which at its outer end holds in precise alignment on the arm a semiconductor wafer 42 having a center 44. The robot 14 also has a second horizontal arm 46 which holds a second wafer 48 with its center 50 precisely aligned on the arm. As shown in FIG. 1 the robot arms 40 and 46 lie on and are extendable along respective longitudinal, parallel axes 52 and 54. The axis 52 intersects the platform center 28 and the wafer center 44. Similarly, the axis 54 intersects the platform center 32 (the position of this center having been adjusted accordingly) and the center 50 of the wafer 48. Thus when the robot arms 40 and 46 are extended to insert the wafers 42 and 48 into the respective chambers 16 and 18 and onto the platforms 26 and 30, the center 44 of the wafer 42 will be exactly aligned over the center 28 of the platform 26, and the center 50 of the wafer 48 will be exactly aligned over the center 32 of the platform 30.

After having determined the angular and longitudinal coordinates of the center 28 of the platform 26 relative to the center axis 56 of the robot 14, which coordinates can be measured with great accuracy, these values are entered as data in a computer (not shown but well known in the art) which controls the robot. Thereafter, whenever the robot 14 is extended, its arm 40 inserts a wafer into the master chamber 16, and that wafer (i.e., the wafer 42) will be positioned over the platform 26 so that the platform center 28 and the wafer center 44 are exactly aligned. Also, by virtue of the present invention, the other arm 46 of the robot 14, which is simultaneously extended into the slave chamber 18, positions the respective wafer 48 so that its center 50 is exactly aligned with the center 32 of the platform 30.

The robot 14 is rotatable around a vertical center 56 within the transfer chamber 12 so that pairs of wafers can be inserted into or withdrawn from the respective processing chambers and/or the load-lock chamber. The wafers are precisely positioned on their respective robot arms 40 and 46. The transfer chamber 12 is hermetically sealable by a respective pair of slit valves 60 in each of the walls of the chamber. These valves 60 are remotely operated in conjunction with the robot 14 to permit its arms 40 and 46 to be inserted into selected ones of the load-lock and processing chambers. Some portions of the apparatus 10 (which are well known) are not shown herein. The general construction and operation of the apparatus 10 may be like that shown in U.S. Pat. No. 5,855,681, which is incorporated herein by reference.

Referring now to FIG. 2, there is shown in exploded relation the mechanism 24 provided in accordance with the invention for adjusting to a preselected degree of accuracy the position of the slave chamber 18 and the center 32 of its platform 30 relative to the center 28 of platform 26 and to the robot 14. The mechanism 24 comprises a front plate 64, a center bellows assembly 66, a rear plate 68, a pair of springs 70 (only one is shown), set screws 72 (only one of which is shown), and fastening bolts 74 (only one of which is shown). The bellows assembly 66 comprises a front flange 76, a rear flange 78, and an accordion-pleated, thin metal bellows 80 (shown here in dashed line) sealed between the front and rear flanges. The flanges 76 and 78 are fastened and sealed to the respective plates 64 and 68 and provide an hermetic seal around a horizontal passage, indicated at 82, through the plates 64 and 68 via which passage a wafer may be inserted into the slave chamber 18. The bellows assembly 66, while maintaining hermetic seal, permits movement of the front plate 64 relative to the rear fixed plate 68, and thus adjustment of the exact position of the slave chamber 18, as will further be explained shortly. The top of the front plate 64 has a rear shoulder 84, which when the mechanism 24 is fastened together, hooks over and bears down upon a top ledge 86 on the rear plate 68.

Figure 3:
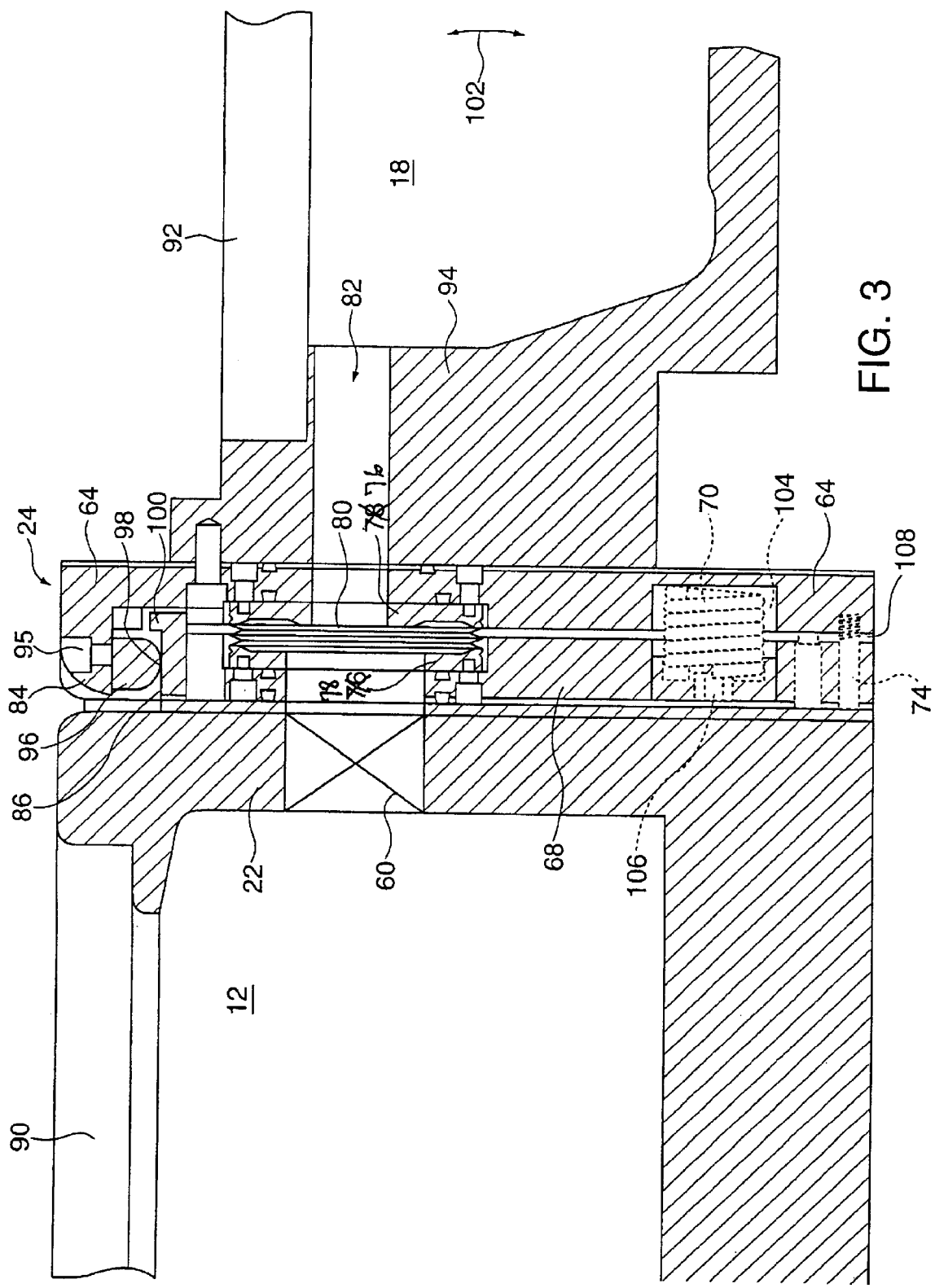
FIG. 3 is a side section view taken as indicated by a line 3—3 in FIG. 1, showing the mechanism of FIG. 2 adjustably coupling one of the chambers of FIG. 1 to a fixed portion of the apparatus.

Referring next to FIG. 3, there is shown a cross-section taken generally along the line 3—3 in FIG. 1, with portions broken away, showing schematically the mechanism 24 as fastened between the transfer chamber 12 and the slave chamber 18. The transfer chamber 12 (as illustrated here but not FIG. 1) has a top lid 90, and the slave chamber 18 has a top lid 92 and a wall 94 with the wafer passage-way 82 extending through it. The transfer chamber 12 is hermetically sealable from the slave chamber 18 by a respective slit valve 60 (shown schematically). The plate 68 of the mechanism 24 is fastened and sealed in fixed relation to the wall 22 of the transfer chamber 12 by bolts and hermetic seals (not otherwise identified). Similarly the plate 64 of the mechanism 24 is fastened and sealed in fixed relation to the wall 94 of the slave chamber 18 by bolts and hermetic seals (not otherwise identified). Lastly, the bellows assembly 66, with its front and rear flanges 76 and 78 and bellows 80, is fastened and hermetically sealed between the plates 64 and 68 by bolts and sealing rings (not otherwise identified). Thus the wafer passage-way 82 is hermetically sealed against gas leakage into or out of it even though the plate 64 is moveable relative to the plate 68.

As is shown in FIG. 3, the plate 64 has its top shoulder 84 overhanging the top ledge 86 of the plate 68. Fastened by screws 95 beneath the shoulder 84 is a longitudinal member 96 which rests on the ledge 86 along a horizontal bearing line indicated at 98. The plate 64, along with the slave chamber 18, hangs on the plate 68, being, in effect, hinged to it along the bearing line 98. The ledge 86 has a front step 100 which prevents the member 96 from falling off of the ledge 86. As will be explained in greater detail shortly, by incrementally expanding or contracting the bellows 80, the slave chamber 18 can be adjusted in the "X", "Y" and "Z" directions relative to the master chamber 16 (see FIG. 1) and to the transfer chamber 12 and the robot 14. The "Z" direction may be represented by an arc 102 illustrated in FIG. 3, the arc 102 indicating a slight amount of swinging of the plate 64 toward or away from the plate 68 during adjustment of the position of the slave chamber 18. Movement along the arc 102 (i.e., the "Z" direction) permits the slave chamber 18 to be leveled and to lie in the same horizontal plane as the master chamber 16.

Positioned near the two lower corners of the plates 64 and 68 are respective ones of the compression springs 70 (see also FIG. 2). One of these springs 70 is shown in dotted outline in FIG. 3 and is positioned within a cavity 104 in the plate 64. A plug 106 screwed through the plate 68 compresses the spring 70 by a desired amount to counterbalance the weight of the slave chamber 18. An identical plug 106 and spring 70 (not shown) near the opposite corner of the plates 64 and 68 are adjusted so that both springs 70 exert the same balancing forces against the plate 64.

Positioned near each spring 70 is a respective one of the set screws 72 (also see FIG. 2). One of these screws 72 is adjusted to bear against the plate 64 so that a desired gap indicated at 108, between the plates 64 and 68 is established adjacent a corner of the plates. A similar gap (not shown and not necessarily the same width) is likewise established by another set screw 72 (not shown) at the opposite corner of the plates 64 and 68. The settings of the various set screws 72 establishes the "X", "Y", and "Z" dimensional adjustments of the position of the slave chamber 18. After the set screws 72 have been adjusted, to desired settings, respective ones of the fastening bolts 74, one of which is shown in dotted outline in FIG. 3, are tightened and the plate 64 held immobile relative to the plate 68, so that the dimensional adjustments described above remain intact.

Referring now to FIG. 4 there is shown a plan view schematically illustrating how the mechanism 24 with its bellows 80 can be expanded or contracted, as indicated by the double-headed arrow 36 (see also FIG. 1) to provide dimensional adjustment of what may be conveniently termed the "Y" position of the slave chamber 18. Here the plates 64, 68 are illustrated as parallel to each other.

Referring now to FIG. 5, there is shown a plan view schematically illustrating how the mechanism 24 with its bellows 80 can be compressed on either end (the right end shown compressed here). This provides for relative angular movement of the plates 64, 68 as indicated by the arc 34 (see also FIG. 1). This movement may be conveniently termed an adjustment in the "X", position of the slave chamber 18.

Referring now to FIG. 6, there is shown a side view schematically illustrating how the mechanism 24 with its bellows 80 can be compressed along its length (the length along the bottom of the bellows 80 being shown as compressed here). This provides for relative angular movement of the plates 64, 68 as indicated by the arc 102 (see also FIG. 3). This movement may be conveniently termed adjustment in the "Z" position of the slave chamber 18.

An apparatus 10, with it mechanism 24 and master and slave chambers 16 and 18, has been built and shown to provide a suitably high degree of accuracy in the centering of semiconductor wafers during processing employing "edge purging". The chambers 16 and 18 easily accommodated wafers of 200 mm size. The slave chamber 18 was adjustable in position by about one-eighth inch (0.125 in.) in each of the "X", "Y" and "Z" directions. Being physically separate units, the chambers 16 and 18 had respective platform centers not appreciably affected by relative thermal expansion, contrary to the case with a single chamber having dual wafer platforms (as known in prior art).

The above description is intended in illustration and not in limitation of the invention. Various changes and modifications in the embodiment illustrated may occur to those skilled in the art and can be made without departing from the spirit or scope of the invention as set forth in the accompanying claims. For example, wafers of different sizes from that given may be processed in the apparatus 10, and the position adjustments of the slave chamber 18 may be different from those given.

What is claimed is:

1. Apparatus for processing multiple semiconductor wafers, the apparatus comprising:

a transfer chamber;

a first processing chamber mounted in fixed relation to the transfer chamber and having a first wafer-holding platform with a center;

a second processing chamber mounted in adjustable relation to the transfer chamber and to the first chamber and having a second wafer-holding platform with a center, wherein the first and second processing chambers are disposed on a common side of the transfer chamber;

a robot rotatably mounted within the transfer chamber and having first and second wafer-holding arms configured parallel to each other for inserting a pair of wafers simultaneously into the first and second chambers; and a mechanism disposed between the second chamber and the transfer chamber, adapted to selectively position the second chamber relative to the robot arms such that the wafers are centered and placed with a preselected degree of accuracy onto the respective platforms for efficient processing of the wafers.

2. The apparatus of claim 1 wherein the first and second chambers are closely spaced self-contained units supported in cantilever fashion from a wall of the transfer chamber, the chambers and the platforms being adapted to simultaneously process wafers using edge purging.

3. Apparatus for processing multiple semiconductor wafers, the apparatus comprising:

a transfer chamber;

a first processing chamber mounted in known relation to the transfer chamber and having a first wafer-holding platform with a center;

a second processing chamber having a second wafer-holding platform with a center, wherein the first and second processing chambers are disposed on a common side of the transfer chamber;

a mechanism for adjustably mounting the second chamber in relation to the first chamber and to the transfer chamber, wherein the mechanism is adapted to selectively position the second chamber in relation to the transfer chamber; and a robot rotatably mounted within the transfer chamber and having first and second wafer-holding arms configured parallel to each other for inserting a pair of wafers simultaneously into the first and second chambers and for placing the wafers accurately centered over the respective platforms, wherein the mechanism selectively positions the second chamber relative to the robot arms such that the wafers are centered and placed with a preselected degree of accuracy onto the respective platforms for efficient processing of the wafers.

4. The apparatus of claim 3 wherein the mechanism comprises a bellows assembly positioned between the transfer chamber and the second chamber, providing a wafer passageway between the chambers while maintaining a hermetic seal.

5. The apparatus of claim 3 wherein the mechanism comprises:

a first plate fastened to a wall of the transfer chamber;

a second plate fastened to a wall of the second chamber;

a bellows assembly sealed between the plates, the bellows assembly responds to relative movement between the plates and provides a hermetically sealed wafer passageway between the chambers; and means for securing the relative positions of the plates once adjustments thereto have been effected.

6. The apparatus of claim 5 wherein the first and second plates are hinged together along a bearing line such that position adjustments thereto can be made in "X", "Y" and "Z" directions.

7. Apparatus for processing at least two semiconductor wafers simultaneously, the apparatus comprising:

a transfer chamber;

a load-lock chamber adjacent the transfer chamber;

a first processing chamber mounted in known relation to the transfer chamber and having a first wafer-holding platform with a center;

a second processing chamber having a second wafer-holding platform with a center, wherein the first and second processing chambers are disposed on a common side of the transfer chamber;

a means disposed between the second chamber and the transfer chamber, adapted to selectively position the second chamber in relation to the first chamber and to the transfer chamber, providing relative movement therebetween, and also providing a wafer passageway therethrough while maintaining a hermetic seal; and a robot rotatably mounted around a center axis within the transfer chamber and having first and second wafer-holding arms configured parallel to each other for withdrawing a pair of wafers from the load-lock chamber and inserting the pair of wafers simultaneously into the first and second chambers and for positioning both of the wafers with a preselected degree of accuracy over the respective platforms.

8. The apparatus of claim 7 further comprising additional processing chambers corresponding respectively to the first and second chamber, the additional chambers being mounted relative to the load-lock chamber in ways respectively like those of the first and second chambers.

9. Apparatus for processing a pair of semiconductor wafers simultaneously, the apparatus comprising:

a transfer chamber;

a load-lock chamber adjacent the transfer chamber;

a first processing chamber mounted in fixed relation to the transfer chamber and having a first wafer-holding platform with a center;

a second processing chamber having a second wafer-holding platform with a center, wherein the first and second processing chambers are disposed on a common side of the transfer chamber;

mechanical means for adjustably mounting the second chamber in relation to the first chamber and to the transfer chamber and adapted to selectively position the second chamber in relation to the transfer chamber; the mechanical means supporting the second chamber against the transfer chamber in cantilever fashion and having a bellows assembly positioned between the transfer chamber and the second chamber to provide for relative movement thereof and to provide a wafer passageway between the respective chambers while maintaining a hermetic seal;

a slit valve adjacent the passageway for hermetically sealing the transfer chamber from the second chamber; and a remotely controlled robot rotatably mounted around a center axis within the transfer chamber and having first and second wafer-holding arms configured parallel to each other for withdrawing a pair of wafers from the load-lock chamber and inserting the pair of wafers simultaneously into the first and second chambers and for positioning both of the wafers to a preselected degree of accuracy over the respective platforms, the second chamber is adjustable by the mechanical means relative to the robot arms and the center axis such that the wafers are centered and placed with the preselected degree of accuracy onto the respective platforms for efficient processing of the wafers.

10. The apparatus of claim 9 wherein the mechanical means provides for adjusting the position of the second chamber in "X", "Y", and "Z" directions, and for thereafter rigidly fastening in place such position.

11. An apparatus for processing multiple semiconductor wafers, comprising:
 a transfer chamber;
 at least one pair of processing chambers disposed about the transfer chamber, wherein each pair of processing chambers comprises:
 a first processing chamber mounted in known relation to the transfer chamber; and
 a second processing chamber adjustably mounted to the transfer chamber, wherein the first and second processing chambers are disposed on a common side of the transfer chamber;
 a mechanism disposed between the second processing chamber and the transfer chamber, adapted to selectively position the second processing chamber in relation to the first processing chamber and in relation to the transfer chamber; and
 a robot mounted within the transfer chamber for inserting a pair of wafers simultaneously into the first and second processing chambers.

12. The apparatus of claim 11, wherein the second chamber is adjustable relative to the robot such that the wafers are centered and placed within a preselected degree of accuracy within the first and the second processing chambers.

13. The apparatus of claim 11, wherein the mechanism comprises a bellows assembly disposed between a first plate and a second plate.

14. The apparatus of claim 11, wherein the first plate is connectable to a side wall of the transfer chamber and the second plate is connectable to a side wall of the second chamber.

15. The apparatus of claim 14, wherein the bellows assembly allows a special relationship of the sidewalls of the transfer chamber and the second chamber to be adjusted thereby positioning a wafer platform within the second chamber in alignment with a wafer platform within the first chamber.

16. The apparatus of claim 15, wherein the robot accurately centers the wafers over the respective platforms when the second chamber is adjusted in relation to the transfer chamber and the first chamber.

17. An apparatus for processing multiple semiconductor wafers, comprising:
 a transfer chamber;
 at least one pair of processing chambers disposed about a common side of the transfer chamber, wherein each pair of processing chambers comprises:
 a first processing chamber disposed in known relation about the transfer chamber;
 a second processing chamber adjustably disposed about the transfer chamber;
 an adjusting mechanism for positioning the second processing chamber relative to the transfer chamber and the first processing chamber;
 a bellows assembly disposed between the second processing chamber and the transfer chamber and adapted to respond to movement of the second processing chamber in relation to the transfer chamber; and
 a robot mounted within the transfer chamber adapted to insert a pair of wafers simultaneously into the first and second processing chambers.

18. The apparatus of claim 17, wherein the bellows assembly responds to the second processing chamber being positioned in relation to the first processing chamber and in relation to the transfer chamber.

19. The apparatus of claim 17, wherein the bellows assembly provides a hermetically sealed wafer passageway between the second processing chamber and the transfer chamber.

20. The apparatus of claim 17, wherein the adjusting mechanism allows angular and longitudinal coordinates of a center of a platform within the second chamber to be aligned with angular and longitudinal coordinates of a center of a platform within the first chamber.

21. The apparatus of claim 17, wherein the robot is rotatable within the transfer chamber so that the pairs of wafers can be inserted into or withdrawn from the at least one pair of processing chambers.

22. The apparatus of claim 17, wherein the robot includes at least one pair of spaced apart and vertically aligned arms.

23. The apparatus of claim 22, wherein the robot arms are extendable along respective longitudinal, parallel axes.

24. An apparatus for processing multiple semiconductor wafers, comprising:
 a transfer chamber;
 at least one pair of processing chambers disposed about a common side of the transfer chamber, wherein each pair of processing chambers comprises:
 a first processing chamber disposed in known relation about the transfer chamber;
 a second processing chamber adjustably disposed about the transfer chamber; and
 a bellows assembly disposed between the second processing chamber and the transfer chamber;
 a mechanism in communication with the bellows assembly adapted to position the second processing chamber relative to the first processing chamber; and
 a robot having horizontal arms and mounted within the transfer chamber for inserting a pair of wafers simultaneously into the first and second processing chambers, the robot having at least two arms extendable along respective longitudinal, parallel axes.

25. The apparatus of claim 1, wherein the mechanism comprises a bellows assembly positioned between the transfer chamber and the second chamber, providing a wafer passageway between the chambers while maintaining a hermetic seal.

26. The apparatus of claim 1, wherein the mechanism comprises:
 a first plate fastened to a wall of the transfer chamber;
 a second plate fastened to a wall of the second chamber;
 a bellows assembly sealed between the plates, allowing relative movement between the plates and a hermetically sealed wafer passageway between the chambers; and means for securing the relative positions of the plates.

27. The apparatus of claim 26, wherein the first and second plates are hinged together along a bearing line such that position adjustments thereto can be. made in "X", "Y" and "Z" directions.

28. The apparatus of claim 25, wherein the bellows assembly maintains a gas tight seal as the mechanism positions the second processing chamber in relation to the first processing chamber and the transfer chamber.

29. The apparatus of claim 26, wherein the bellows assembly maintains a gas tight seal as the mechanism positions the second processing chamber in relation to the first processing chamber and the transfer chamber.

30. The apparatus of claim 1, wherein the mechanism adjusts angular and longitudinal coordinates of the center of the platform within the second chamber relative to angular and longitudinal coordinates of the center of the platform within the first chamber.

31. An apparatus for processing multiple semiconductor wafers, comprising:
  a transfer chamber;
  at least one pair of processing chambers disposed about a common side of the transfer chamber, wherein each pair of processing chambers comprises:
    a first processing chamber disposed in known relation about the transfer chamber; and
    a second processing chamber adjustably disposed about the transfer chambers wherein the second processing chamber comprises:
      a first plate fastened to a wall of the transfer chamber;
      a second plate fastened to a wall of the second processing chamber;
      a bellows assembly scaled between the first and second plates; and
      at least one spring disposed between the first and second plates; and
  a robot having horizontal arms and mounted within the transfer chamber for inserting a pair of wafers simultaneously into the first and second processing chambers, the robot having at least two arms extendable along respective longitudinal, parallel axes.

32. The apparatus of claim 31, wherein the at least one spring comprises a pair of springs each disposed adjacent a lower corner of the first and second plates.

* * * * *

UNITED STATES PATENT AND TRADEMARK OFFICE
CERTIFICATE OF CORRECTION

PATENT NO.      : 6,793,766 B2
DATED           : September 21, 2004
INVENTOR(S)     : Eric W. Chieve and Lawrence Chung-Lai Lei It is certified that error appears in the above-identified patent and that said Letters Patent is hereby corrected as shown below:

Column 9,
Line 49, please delete "special" insert -- spatial --.

Signed and Sealed this

Twenty-first Day of June, 2005

JON W. DUDAS
*Director of the United States Patent and Trademark Office*